US006131799A

United States Patent [19]

Egger et al.

[11] Patent Number: 6,131,799

[45] Date of Patent: Oct. 17, 2000

[54] METHOD OF MAKING WIRE CONNECTIONS OF PREDETERMINED SHAPE

[75] Inventors: Hans Egger, Sins; Marit Seidel, Unterägeri, both of Switzerland

[73] Assignee: Esec SA, Cham, Switzerland

[21] Appl. No.: 09/227,279

[22] Filed: Jan. 7, 1999

[30] Foreign Application Priority Data

Jan. 15, 1998 [CH] Switzerland .................. 1998 0075/98

[51] Int. Cl.[7] ............................ B23K 1/06; B23K 37/00; B23K 31/00

[52] U.S. Cl. ......................... 228/180.5; 228/1.1; 228/4.5; 228/179.1

[58] Field of Search ................................ 228/180.5, 1.1, 228/4.5, 179.1

[56] References Cited

U.S. PATENT DOCUMENTS

| | | | |
|---|---|---|---|
| 4,080,009 | 3/1978 | Marathe et al. | 308/3.5 |
| 4,327,860 | 5/1982 | Kirshenboin et al. | 228/179 |
| 4,597,522 | 7/1986 | Kobayashi | 228/179 |
| 4,730,945 | 3/1988 | Luther et al. | 384/45 |
| 4,819,326 | 4/1989 | Stannek | 29/837 |
| 4,932,584 | 6/1990 | Yamazaki et al. | 228/179 |
| 4,934,891 | 6/1990 | Hawkswell | 414/223 |
| 4,937,511 | 6/1990 | Herndon et al. | 318/568.21 |
| 4,976,392 | 12/1990 | Smith et al. | 228/102 |
| 5,023,544 | 6/1991 | Vallone et al. | 324/158 F |
| 5,024,720 | 6/1991 | Boss et al. | 156/584 |
| 5,086,559 | 2/1992 | Akatsuchi | 29/834 |
| 5,111,989 | 5/1992 | Holdgrafer et al. | 228/110 |
| 5,148,964 | 9/1992 | Shimizu | 228/102 |
| 5,152,858 | 10/1992 | Winter | 156/157 |
| 5,156,323 | 10/1992 | Kumazawa et al. | 228/179 |
| 5,157,617 | 10/1992 | Ramsey | 364/478 |
| 5,158,223 | 10/1992 | Shimizu | 228/1.1 |
| 5,192,018 | 3/1993 | Terakado et al. | 228/179 |
| 5,205,463 | 4/1993 | Holdgrafer et al. | 228/102 |
| 5,259,548 | 11/1993 | Yamazaki et al. | 228/180.5 |
| 5,339,939 | 8/1994 | Gueble et al. | 198/345.2 |
| 5,342,460 | 8/1994 | Hidese | 156/64 |
| 5,380,099 | 1/1995 | Teramachi | 384/45 |
| 5,395,035 | 3/1995 | Nakao | 228/4.5 |
| 5,452,841 | 9/1995 | Sibata et al. | 228/180.5 |
| 5,455,409 | 10/1995 | Smith et al. | 235/385 |
| 5,459,794 | 10/1995 | Ninomiya et al. | 382/145 |
| 5,488,771 | 2/1996 | Devitt et al. | 29/898.02 |
| 5,553,376 | 9/1996 | Solanki et al. | 29/833 |
| 5,562,384 | 10/1996 | Alvite et al. | 414/222 |
| 5,564,188 | 10/1996 | Akasako et al. | 29/898.03 |
| 5,586,713 | 12/1996 | Arita et al. | 228/102 |
| 5,591,920 | 1/1997 | Price et al. | 73/828 |
| 5,694,443 | 12/1997 | Stone et al. | 377/6 |
| 5,713,125 | 2/1998 | Watanabe et al. | 29/833 |
| 5,768,759 | 6/1998 | Hudson | 29/407.04 |
| 5,794,330 | 8/1998 | Distefano et al. | 29/840 |
| 5,838,574 | 11/1998 | Olson et al. | 364/478.07 |
| 5,838,754 | 11/1998 | Olson et al. | 364/478.07 |
| 5,885,052 | 3/1999 | Tsuji et al. | 414/744.6 |
| 5,941,674 | 8/1999 | Briehl | 414/417 |
| 5,967,401 | 10/1999 | Nishiura et al. | 228/180.5 |

FOREIGN PATENT DOCUMENTS

| | | | |
|---|---|---|---|
| 0 792 716 | 9/1997 | European Pat. Off. | B23K 20/00 |

*Primary Examiner*—Patrick Ryan
*Assistant Examiner*—Cecilia Newsome
*Attorney, Agent, or Firm*—D'Alessandro & Ritchie

[57] ABSTRACT

In a method of making a wire connection of predetermined shape between a first connecting point located on a semiconductor chip and a second connecting point a capillary is moved along a predetermined trajectory. After attaching the wire at the first connecting point the capillary is moved up to a first point for the performing of one or two kinks and for the pulling out of the wire as far as the required total length of the wire connection. From the first point, the capillary is moved along a circular arc up to a second point, at which the wire is locked in the capillary. The circular arc is centered in the first connecting point or in the immediate vicinity of the first connecting point. The method is suitable for the wiring of CSPs (Chip Scale Packages). The movement along the circular arc prevents the wire from being pushed back through the capillary. As soon as the wire is locked in the capillary, the second connecting point can be approached without difficulty.

8 Claims, 1 Drawing Sheet

$L_1$ $K_1$ $K_2$ $L_H$ $\alpha_1$ $\alpha_2$ 2 $L_2$ 4 1 5 3 D

METHOD OF MAKING WIRE CONNECTIONS OF PREDETERMINED SHAPE

PRIORITY CLAIM

The present application claims priority under 35 U.S.C. § 119 based upon Swiss application no. 1998 0075/98, filed Jan. 15, 1998.

BACKGROUND OF THE INVENTION

The present invention relates to a method of making wire connections of predetermined shape between a first connecting point located on a semiconductor chip and a second connecting point. During semiconductor assembly, the electrical connections between the semiconductor chip and the substrate which carries the semiconductor chip are produced by means of such wire connections. Such methods are known for example from the documents U.S. Pat. No. 4,327,860, U.S. Pat. No. 5,111,989, U.S. Pat. No. 5,395,035, U.S. Pat. No. 5,148,964, U.S. Pat. No. 5,192,018, U.S. Pat. No. 5,205,463 and EP 792 716.

SUMMARY OF THE INVENTION

The object of the invention is to propose a method for producing a shaped wire connection which is suitable for wire connections for so-called CSPs (Chip Scale Package or Chip Size Package).

DETAILED DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

Figure 1:
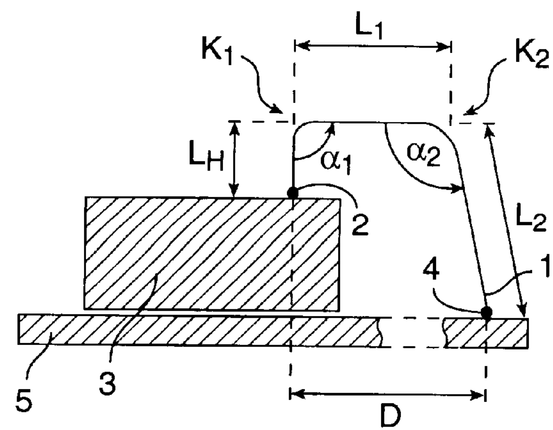
FIG. 1 is a diagram showing a wire connection 1 of predetermined shape which connects a connecting point on a semiconductor chip with a connecting point on a substrate.

FIG. 1 shows a wire connection 1 of predetermined shape which connects a first connecting point 2 on a semiconductor chip 3 with a second connecting point 4 on a substrate 5. The wire connection 1 has two kinks $K_1$ and $K_2$ to which the angles $\alpha_1$ and $\alpha_2$ are assigned. Angle $\alpha_1$ amounts to almost 90°. Angle $\alpha_2$ is somewhat larger than 90° and amounts typically to 100–120°. In special cases however, the angle $\alpha_2$ can amount to up to 150°. The length L of the wire connection 1 amounts to $L=L_H+L_1+L_2-\delta_1-\delta_2$. $L_H$ denotes the loop height, $L_1$ the distance from the first kink $K_1$ up to the second kink $K_2$ and $L_2$ the distance of the second kink $K_2$ from the second connecting point 4. $\delta_1$ and $\delta_2$ denote two correction values as the wire connection 1 demonstrates a curved and not an angular development at the two kinks $K_1$ and $K_2$. For CSPs, it is required that the loop height $L_H$ as well as the distance D between the two connecting points 2 and 4 be as short as possible. In addition, the loop height $L_H$ must disperse only slightly from wire connection 1 to wire connection 1 and the wire connection 1 between the first kink $K_1$ and the second kink $K_2$ should run as parallel as possible to the surface of the substrate 5 so that, on the one hand, the distance between the wire connection 1 and the edge of the semiconductor chip 3 remains large enough to guarantee the electrical insulation and, on the other hand, the distance remains large enough between the wire connection 1 and the edge of the CSP housing which arises from the subsequent encapsulation.

Figure 2:
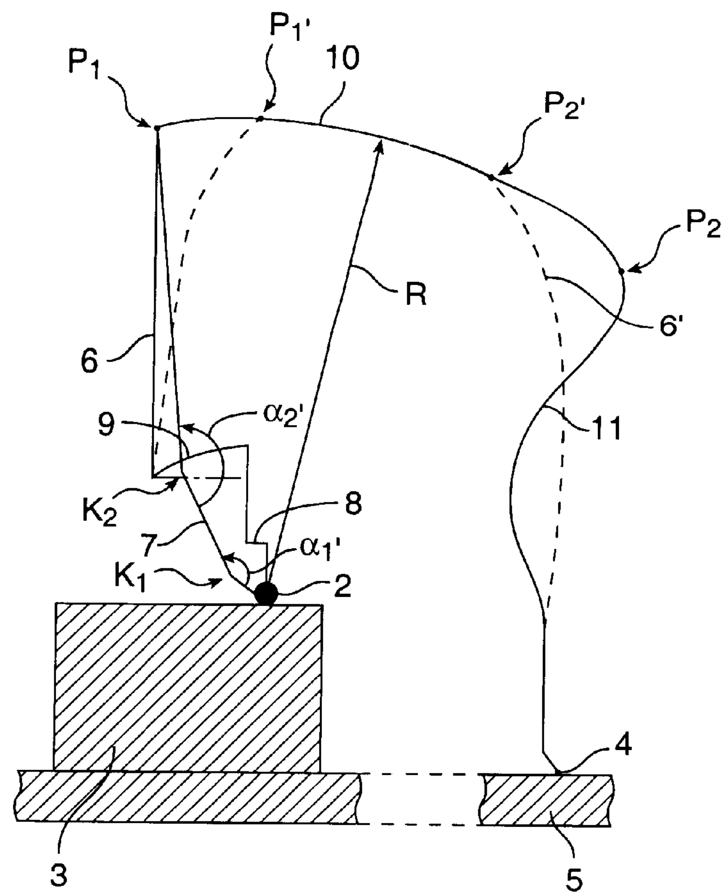
FIG. 2 is a diagram showing a trajectory moved through by a capillary to produce the wire connection.

FIG. 2 shows a predetermined trajectory 6 ran through by a capillary which leads from the first connecting point 2 located on the semiconductor chip 3 to the second connecting point 4 lying on the substrate 5. For this, the horizontally and vertically movable capillary is guided by a drive mechanism. A wire 7 runs through the capillary. The capillary serves not only to attach the wire 7 to the two connecting points 2, 4 but also to guide the wire 7 along the trajectory 6.

After attaching the wire 7 to the first connecting point 2, the capillary is moved along the trajectory 6 up to a first point $P_1$ for forming the kink $K_2$ and to pull out the wire 7 as far as the required total length L for the wire connection 1 (FIG. 1) to be produced. Optionally, kink $K_1$ is also formed. Forming kink $K_2$ and, if necessary, kink $K_1$ takes place in a well known manner by means of one or two so-called reverse movements 8, 9 which are movements directed away from the second connecting point 4. On passing through the point $P_1$ the wire 7 is optionally secured by a wire clamp. Afterwards, the capillary is moved further from point $P_1$ along a circular arc 10 up to a second point $P_2$ at which the wire 7 is locked in the capillary. The radius R of the circular arc 10 is centered in the first connecting point 2 or in immediate vicinity to the first connecting point 2 and, as the wire 7 is not straight, is somewhat less than the total length L of the wire connection. The movement of the capillary along this circular arc 10 prevents the wire from being pushed back through the capillary in the direction of the wire reel. Pushing back of the wire through the capillary and the possible later unreeling would take place in a jerking fashion because of the transition from the higher static friction to the lower sliding friction and lead to an uncontrollable total length L of the wire connection 1 and possibly to undesirable abrasion marks. This could give rise to a lower constancy of the loop height $L_H$ and a worse parallelism of the wire piece between the two kinks $K_1$ and $K_2$ and the surface of the substrate 5 or the edge of the CSP housing As soon as the wire 7 is locked in the capillary (at point $P_2$), the capillary can move through any trajectory curve within certain limits without the wire being pushed back through the capillary. With the invention, an extremely low dispersion of the loop height $L_H$ is established as well as only minor deviations of the parallelism of the said wire piece.

When the capillary is located at the second point $P_2$, then the kinks $K_1$ and $K_2$ are still not very pronounced, i.e., the angles $\alpha_1$' and $\alpha_2$' are considerably larger than the sought for values of 90° or 100–120°. In order to already obtain a sharper pronouncement of the kinks $K_1$ and $K_2$ during production of the wire connection 1, the capillary is advantageously moved on the trajectory 6 between the point $P_2$ and the second connecting point 4 along a loop 11 directed against the first connecting point 2. As the wire 7 is securely locked while the capillary passes through the loop 11, no wire is pushed back through the capillary even when the distance between the trajectory 6 and the first connecting point 2 is less than the required length L of the wire connection 1. A proper formation of the kinks $K_1$ and $K_2$ on passing through the trajectory 6 results in the constancy of the loop height $L_H$ and the parallelism of the wire piece between the two kinks $K_1$ and $K_2$ to the surface of the substrate 5 being guaranteed within tight tolerances.

The position of point $P_2$ on the trajectory 6, where the wire 7 is locked in the capillary depends on various factors such as the characteristics of the wire 7 and the capillary, the length L of the wire connection 1, etc. If the position of point $P_2$ is shifted, for example to point $P_2'$, then a direct trajectory 6' shown as a dotted line can possibly be used instead of the loop 11.

Preferably, the trajectory 6 has a first and second reverse moments 8 and 9 to form the two kinks $K_1$ and $K_2$. The second reverse movement 9 is preferably moved along a circular arc centered in the second connecting point 4 so that no wire is pulled out of the capillary during this movement phase. If the second reverse movement 9 does not take place along the arc trajectory, but linear, as drawn with a dotted line, parallel to the surface of the semiconductor chip 3, then, during this movement phase, the wire is pulled through the capillary as the distance of the trajectory 6 to the first connecting point 2 increases. As the result of friction between the wire and the capillary, undesirable abrasion marks occur on the wire on the one hand and, on the other hand, the pulled out length of wire is subject to certain variations.

The second kink $K_2$ is formed by means of the second reverse movement 9. If the movement of the capillary to unreel the wire 7 as far as the required wire length L takes place purely vertically up to point $P_1$, then there is practically no friction between the wire 7 and the capillary so that the unreeled length of wire is definitely reproducible. However, to shorten the bond cycle, it is possible on unreeling the wire 7 to lead the capillary not only vertically but also with a horizontal movement component to a point $P_1'$ instead of to point $P_1$. The point $P_1'$ can be passed through without a stop movement.

The parallelism of the wire piece between the two kinks $K_1$ and $K_2$ to the surface of the substrate 5 can be calibrated by means of altering the total length L of the wire 7 which is unreeled. Correspondingly, the distance of point $P_1$ from the first connecting point 2 is increased or decreased and thereby also the radius R of the circular arc 10. In order to be able to perfectly bond wire connections of varying lengths for a semiconductor chip 3, it is planned that a correction factor $\delta=\delta_1+\delta_2$ is envisaged for determining the wire length L whose value changes, e.g., linearly, depending on the lengths $L_1$ and/or $L_2$.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. A method of making a wire connection between a first connecting point located on a semiconductor chip and a second connecting point, said wire connection showing a first kink and a second kink, said second kink having an angle of less than 120°, whereby a wire runs through a capillary which attaches said wire to said first and second connecting points and guides said wire between said first and second connecting points, said method comprising:

attaching the wire to the first connecting point;

moving the capillary along a predetermined trajectory up to a first point, for forming at least the second kink and for pulling the wire out an amount required to equal the total length of the wire connection;

moving the capillary from said first point along a circular arc up to a second point at which the wire is locked in the capillary, said circular arc being centered over the first connecting point or in the immediate vicinity of the first connecting point; and moving the capillary to the second connecting point.

2. A method according to claim 1, wherein the capillary is moved from the second point to the second connecting point along a loop directed against the first connecting point.

3. A method according to claim 1, wherein on passing through the first point the wire is secured by means of a wire clamp.

4. A method according to claim 2, wherein on passing through the first point the wire is secured by means of a wire clamp.

5. A method according to claim 1, wherein the angle of the second kink is less than 100°.

6. A method according to claim 2, wherein the angle of the second kink is less than 100°.

7. A method according to claim 3, wherein the angle of the second kink is less than 100°.

8. A method according to claim 4, wherein the angle of the second kink is less than 100°.

* * * * *

UNITED STATES PATENT AND TRADEMARK OFFICE

CERTIFICATE OF CORRECTION

PATENT NO. : 6,131,799
DATED : October 17, 2000
INVENTOR(S) : Egger et al.

It is certified that error appears in the above-identified patent and that said Letters Patent is hereby corrected as shown below:

Column 1,
Line 30, add:

-- In a method of making a wire connection of predetermined shape between a first connecting point located on a semiconductor chip and a second connecting point a capillary is moved along a predetermined trajectory. After attaching the wire at the first connecting point the capillary is moved up to a first point for the performing of one or two kinks and for the pulling out of the wire as far as the required total length of the wire connection. From the first point, the capillary is moved along a circular arc up to a second point, at which the wire is locked in the capillary. The circular arc is centered in the first connecting point or in the immediate vicinity of the first connecting point. The method is suitable for the wiring of CSPs (Chip Scale Packages). The movement along the circular arc prevents the wire from being pushed back through the capillary. As soon as the wire is locked in the capillary, the second connecting point can be approached without difficulty. --

Column 2,
Line 7, replace "ran" with -- run --.
Line 14, replace "2, 4 but" with -- 2 and 4, but --.
Line 23, replace "8, 9 which" with -- 8 and 9, which --.

Column 3,
Line 8, after "has" delete "a".
Line 16, after "then" delete ",".

Signed and Sealed this

Eighteenth Day of December, 2001

Attest:

JAMES E. ROGAN
*Director of the United States Patent and Trademark Office*

*Attesting Officer*